United States Patent
Teeter et al.

(10) Patent No.: US 9,583,471 B2
(45) Date of Patent: Feb. 28, 2017

(54) INTEGRATED CIRCUIT MODULE HAVING A FIRST DIE WITH A POWER AMPLIFIER STACKED WITH A SECOND DIE AND METHOD OF MAKING THE SAME

(71) Applicant: RF Micro Devices, Inc., Greensboro, NC (US)

(72) Inventors: Douglas Andrew Teeter, Lexington, MA (US); Ming Ji, Melrose, MA (US); Bhavin Shah, Arlington, MA (US); Mohsen Haji-Rahim, Chapel Hill, NC (US); William Kent Braxton, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/595,451

(22) Filed: Jan. 13, 2015

(65) Prior Publication Data
US 2015/0200189 A1 Jul. 16, 2015

Related U.S. Application Data

(60) Provisional application No. 61/926,504, filed on Jan. 13, 2014.

(51) Int. Cl.
*H01L 25/04* (2014.01)
*H01L 25/065* (2006.01)
(Continued)

(52) U.S. Cl.
CPC .......... *H01L 25/18* (2013.01); *H01L 23/4012* (2013.01); *H01L 23/66* (2013.01);
(Continued)

(58) Field of Classification Search
CPC ............... H01L 25/043; H01L 25/0657; H01L 25/0756; H01L 25/0652; H01L 23/4012
See application file for complete search history.

(56) References Cited

U.S. PATENT DOCUMENTS

| | | | |
|---|---|---|---|
| 2010/0309704 A1* | 12/2010 | Dattaguru | H01L 23/5384 365/51 |
| 2013/0307628 A1* | 11/2013 | Ma | H01L 23/66 330/296 |

OTHER PUBLICATIONS

Author Unknown, "3D & Stacked-Die Packaging," Data Sheet, AMKOR Technology, Dec. 2012, http://www.amkor.com/go/3d-stacked-die-packaging, 2 pages.
(Continued)

*Primary Examiner* — Phat X Cao
(74) *Attorney, Agent, or Firm* — Withrow & Terranova, P.L.L.C.

(57) ABSTRACT

Disclosed is an integrated circuit module that includes a first die having a plurality of hot regions and at least one cool region when operating under normal conditions. The first die with a top surface includes at least one power amplifier that resides in the plurality of hot regions. The integrated circuit module also includes a second die. The second die has a bottom surface, which is adhered to the top surface of the first die, wherein any portion of the bottom surface of the second die that is adhered to the top surface of the first die resides exclusively on the at least one cool region. In at least one embodiment, the first die is an RF power amplifier die and the second die is a controller die having control circuitry configured to control the at least one power amplifier that is an RF power amplifier type.

20 Claims, 8 Drawing Sheets

(51) Int. Cl.
  H01L 25/18    (2006.01)
  H03F 3/195    (2006.01)
  H01L 25/00    (2006.01)
  H01L 23/00    (2006.01)
  H01L 23/40    (2006.01)
  H01L 25/075   (2006.01)
  H01L 23/66    (2006.01)

(52) U.S. Cl.
  CPC .......... *H01L 24/48* (2013.01); *H01L 25/043* (2013.01); *H01L 25/0652* (2013.01); *H01L 25/0657* (2013.01); *H01L 25/0756* (2013.01); *H01L 25/50* (2013.01); *H03F 3/195* (2013.01); *H01L 24/45* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/48106* (2013.01); *H01L 2224/48145* (2013.01); *H01L 2224/48227* (2013.01); *H01L 2224/49096* (2013.01); *H01L 2924/00014* (2013.01); *H01L 2924/10253* (2013.01); *H01L 2924/10329* (2013.01); *H01L 2924/141* (2013.01); *H01L 2924/143* (2013.01); *H01L 2924/2064* (2013.01); *H01L 2924/20102* (2013.01); *H01L 2924/20103* (2013.01); *H03F 2200/531* (2013.01)

(56) References Cited

OTHER PUBLICATIONS

Author Unknown, "FlipStack CSP," Data Sheet, AMKOR Technology, Sep. 2010, www.amkor.com, 2 pages.
Author Unknown, "Package on Package (PoP) Family," Data Sheet, AMKOR Technology, Dec. 2012, www.amkor.com, 4 pages.
Author Unknown, "Stacked CSP," Data Sheet, AMKOR Technology, Apr. 2013, www.amkor.com, 2 pages.
Benkart, Peter, et al., "3D Chip Stack Technology Using Through-Chip Interconnects," IEEE Design and Test of Computers, vol. 22, No. 6, Nov.-Dec. 2005, pp. 512-518.
Kada, Morihiro, et al., "Advancements in Stacked Chip Scale Packaging (S-CSP), Provides System-in-a-Package Functionality for Wireless and Handheld Applications," Proceedings of Pan Pacific Microelectronics Symposium Conference, Jan. 2000, pp. 1-7.
Kim, Dohyung, et al., "Evaluation for UV Laser Dicing Process and its Reliability for Various Designs of Stack Chip Scale Package," 2009 Electronic Components and Technology Conference, May 26-29, 2009, pp. 1531-1536.
Scarselli, Eleonora Franchi, et al., "Automatic Compensation of the Voltage Attenuation in 3-D Interconnection Based on Capacitive Coupling," IEEE Journal of Solid-State Circuits, vol. 46, No. 2, Feb. 2011, pp. 498-506.

\* cited by examiner

| | POUT (dBm) | STAGE 1 | | | STAGE 2 | | |
|---|---|---|---|---|---|---|---|
| | | VCC1 (V) | ICC1 (A) | PDISS1 (W) | VCC2 (V) | ICC2 (A) | PDISS2 (W) |
| APT MODE | 28 | 4.2 | 0.045 | 0.17 | 4.2 | 0.415 | 1.11 |
| ET MODE | 28 | 2.5 | 0.030 | 0.05 | 2.5 | 0.460 | 0.52 |

| LAYER | APT MODE NOMINAL-Δ | ET MODE NOMINAL-Δ | APT MODE NOMINAL | ET MODE NOMINAL | APT MODE NOMINAL+Δ | ET MODE NOMINAL+Δ |
|---|---|---|---|---|---|---|
| Si DIE OFFSET X/Y | | | | | | |
| MOLD COMPOUND | 94.8 | 89.3 | 94.7 | 89.3 | 94.9 | 89.4 |
| Si DIE TOP | 94.7 | 89.3 | 95.9 | 89.8 | 97.7 | 90.6 |
| Si DIE ATTACH | 100.0 | 91.5 | 104.7 | 93.4 | 111.9 | 96.4 |
| DIE TOP | 156.3 | 116.2 | 156.2 | 116.1 | 156.0 | 116.1 |
| GaAs DIE | 161.2 | 118.2 | 161.2 | 118.2 | 160.9 | 118.1 |
| GaAs DIE ATTACH | 106.9 | 95.0 | 106.9 | 94.9 | 106.8 | 94.9 |
| LAMINATE | 92.8 | 88.5 | 92.8 | 88.5 | 92.8 | 88.5 |
| SOLDER | 86.6 | 85.7 | 86.6 | 85.7 | 86.6 | 85.7 |
| BOTTOM | 85.0 | 85.0 | 85.0 | 85.0 | 85.0 | 85.0 |
| ΔTj - SiTOP | 66.6 | 29.0 | 65.3 | 28.4 | 63.2 | 27.6 |
| PDISS (W) | 1.280 | 0.570 | 1.280 | 0.570 | 1.280 | 0.570 |
| Rth_j - SiTOP | 52.0 | 50.8 | 51.0 | 49.9 | 49.4 | 48.4 |
| Rth_l - REFERENCE | 59.5 | 58.3 | 59.5 | 58.2 | 59.3 | 58.1 |

*FIG. 6*

INTEGRATED CIRCUIT MODULE HAVING A FIRST DIE WITH A POWER AMPLIFIER STACKED WITH A SECOND DIE AND METHOD OF MAKING THE SAME

RELATED APPLICATIONS

This application claims the benefit of provisional patent application Ser. No. 61/926,504, filed Jan. 13, 2014, the disclosure of which is hereby incorporated herein by reference in its entirety.

FIELD OF THE DISCLOSURE

The present disclosure relates to power amplifier modules, and in particular to RF power amplifier modules.

BACKGROUND

In contrast to low power circuits, power amplifiers have the added challenge of localized hot regions on the power amplifier die which result in large changes in temperature across the die. These hot regions will heat up a die placed directly over them. Often the semiconductor material for the RF power amplifier die is typically gallium arsenide (GaAs), which is a made of a different semiconductor material than the controller die, which is typically made of silicon (Si). The coefficient of thermal expansion (CTE) for GaAs is 6.86 ppm per degree Celsius (ppm/° C.) and for Si the CTE is 2.6 ppm/° C. As a result, large gradients in temperature across the GaAs die and the Si die can cause mechanical stress due to differences in the CTE. What is needed is an integrated circuit module having a power amplifier die and a controller die that are arranged such that mechanical stress due to differences in the CTE is minimized.

SUMMARY

An integrated circuit module that includes a first die having a plurality of hot regions and at least one cool region when operating under normal conditions is disclosed. The first die with a top surface includes at least one power amplifier that resides in the plurality of hot regions. The integrated circuit module also includes a second die. The second die has a bottom surface, which is adhered to the top surface of the first die, wherein any portion of the bottom surface of the second die that is adhered to the top surface of the first die resides exclusively on the at least one cool region. In at least one embodiment, the first die is an RF power amplifier die and the second die is a controller die having control circuitry configured to control the at least one power amplifier that is an RF power amplifier type.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 6 is a second table that lists temperatures for layers making up the stacked RF amplifier die and the controller die for various relative positions and operating modes.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figures 1A, 1B:
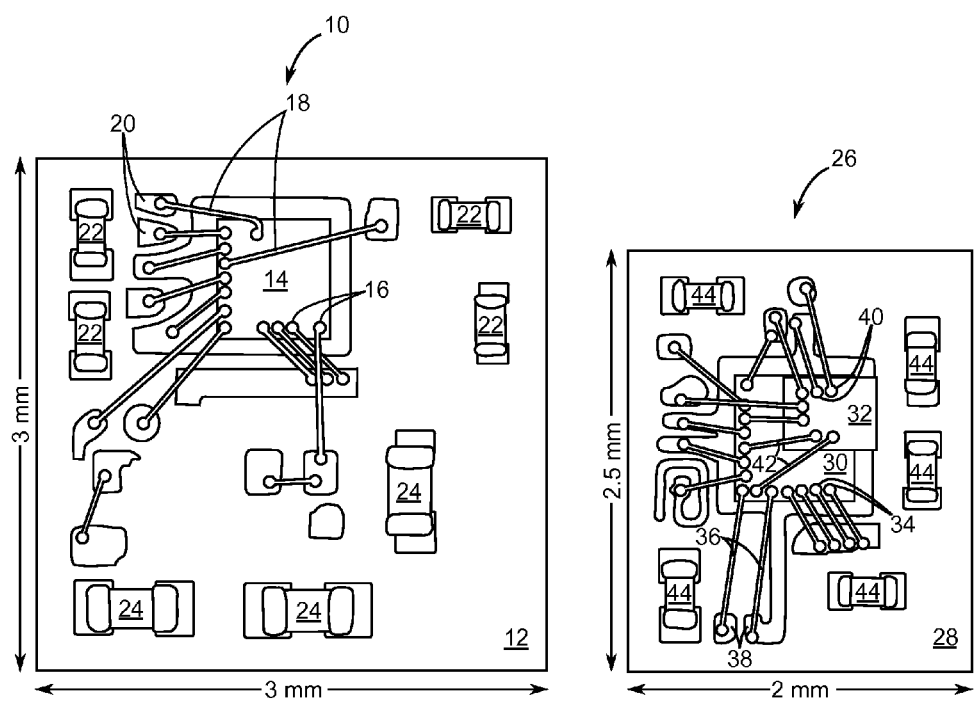
FIG. 1A is a line drawing of a related art integrated circuit module that has a relatively large 3×3 mm area that includes an RF power die and no controller die.
FIG. 1B is a line drawing of an integrated circuit module that in accordance with the present disclosure has a relatively small 2.5×2 mm area that includes an RF power amplifier die stacked with a controller die that is configured to control the RF power amplifier die.

FIG. 1A is a line drawing of a related art integrated circuit module 10 that has a relatively large 3×3 mm substrate 12 that includes an RF power amplifier die 14 and no controller die. The RF power amplifier die 14 is mounted on the substrate 12. The RF power amplifier die 14 includes electrically conductive pads 16 that are connected by bonding wires 18 to printed circuit pads 20 that reside on the substrate 12. Passive components such as inductors 22 and capacitors 24 take up area on the substrate 12 such that additional circuitry such as a controller for the RF power amplifier die 14 is difficult to integrate.

FIG. 1B is a line drawing of an integrated circuit module 26 that in accordance with the present disclosure has a relatively small 2.5×2 mm substrate 28 that includes an RF power amplifier die 30 stacked with a controller die 32 that is configured to control the RF power amplifier die 30. In at least one embodiment, the controller die 32 comprises silicon (Si) technology, and further comprises complementary metal oxide semiconductor (CMOS) technology. In contrast, in at least one embodiment, the RF power amplifier die 30 comprise gallium arsenide (GaAs) technology.

The RF power amplifier die 30 includes electrically conductive pads 34 that are connected by a first plurality of bonding wires 36 to printed circuit pads 38 that reside on the substrate 28. The controller die 32 includes electrically conductive pads 40 that are connected by a second plurality of bonding wires 42.

A thickness of the second plurality of bonding wires 42, referred to herein as bond line thickness, can be on the order of around about 10 μm to around about 20 μm. Other dimensions with regard to the second plurality of bonding wires 42 are loop height and wire profile along with bond pad-to-bond pad distance. In the exemplary embodiments shown in FIG. 1B and again in FIG. 10, a desirable loop height ranges less than around about 75 μm from a mold cap (not shown) for an encapsulate that is ultimately added to protect the integrated circuit module 26. Each wire profile for the first plurality of bonding wires 36 and the second plurality of bonding wires 42 must meet mechanical design rule checks to ensure mechanical clearances.

Further still, capillary selection for a wire bonding tool (not shown) should be considered to allow for a high volume manufacturing environment. The present embodiments are manufacturable using gold (Au) or copper (Cu) bonding wires 42. Other metals such as aluminum (Al) or silver (Ag) may also be used for bonding. As such, an exemplary capillary aperture diameter ranges from around about 30 μm to around about 33 μm. It should be noted that the present embodiments were fabricated with a thickness of the controller die 32 being less than 200 μm. A new bonding tool should be selected if the thickness of the controller die 32 is greater than 200 μm.

When setting up the wire bonding tool for operation, parameters such as bonding force, capillary velocity, and scrubbing force are considered. These three parameters are important because the controller die 32 in some embodiments overhangs the RF power amplifier die 30, and poor setting of these parameters can result in dislocating and/or damaging the controller die 32. An exemplary bonding force ranges between around about 20 g to around about 40 g. An exemplary capillary velocity is between around 0.3 mils/ms to around about 0.4 mils/ms, while a scrubbing force is set by a current flow that ranges from around about 80 mA to around about 100 mA.

It is also desirable that passive components 44 are relatively densely located on the substrate 28 such that the area of the integrated circuit module 26 is minimized. In at least one embodiment and during simulations the substrate 28 is a fiberglass laminate.

Figure 2:
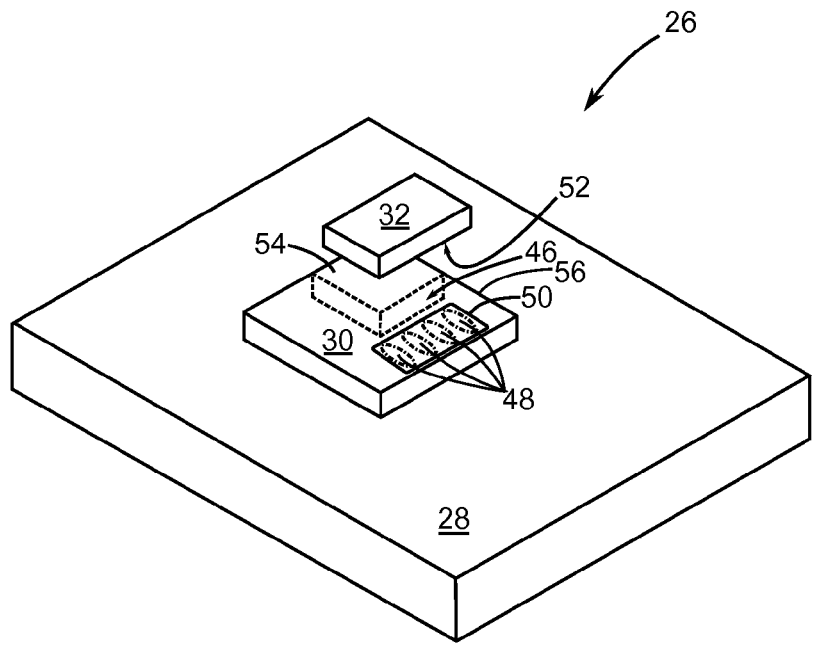
FIG. 2 is a simplified three dimensional illustration of an exploded view of an embodiment of the integrated circuit module of FIG. 1B.

FIG. 2 is a simplified three dimensional illustration of an exploded view of an embodiment of the integrated circuit module 26 of FIG. 1B. The RF power amplifier die 30 is fixed to the substrate 28. The RF power amplifier die 30 is attached to the substrate 28 using a standard conductive die attach epoxy. However, in this illustration, the controller die 32 is shown lifted above the RF power amplifier die 30 to reveal at least one cool region 46 shown outlined in dashed line. The at least one cool region 46 is located away from a plurality of hot regions 48 that are generated during the operation of at least one RF power amplifier 50 that comprises the RF power amplifier die 30.

The controller die 32 has at least a portion of a bottom surface 52 that is fixed to a portion of a top surface 54 of the RF power amplifier die 30 during fabrication of the integrated circuit module 26. In at least one embodiment only a first portion of the bottom surface 52 of the controller die 32 is adhered to the top surface of the RF power amplifier die 30 to reside exclusively on the at least one cool region 46. A second region of the controller die 32 hangs over a peripheral edge 56 of the RF power amplifier die 30.

In this regard, it is desirable for a contact area making up the first portion of the bottom surface 52 to be around about 60% or higher of a total backside area of the controller die 32. In this way, mechanical integrity of a bond between the RF power amplifier die 30 and the controller die 32 is ensured.

Figure 3:
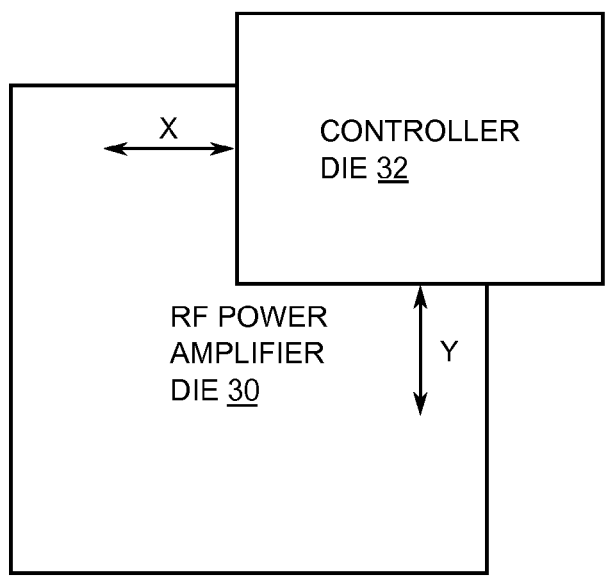
FIG. 3 is a line drawing of a simplified top view of exemplary X-Y positioning ranges of the controller die of FIG. 1B relative to the RF power amplifier die.

FIG. 3 is a line drawing of a simplified top view of exemplary X-Y positioning ranges of the controller die 32 relative to the RF power amplifier die 30. Permanent placement of the controller die 32 relative to the RF power amplifier die 30 is determined based on several factors with a prime consideration being maximization of a steady state temperature difference between the controller die 32 and the RF power amplifier die 30 during operation. In particular, the controller die 32 is positioned and fixed to the RF power amplifier die 30 at a location such that the controller die 32 operates at a significantly cooler temperature than the RF power amplifier die 30.

In this regard, simulations of thermal performances for the integrated circuit module 26 (FIGS. 1B and 2) are useful for determining a desired X-Y coordinate to fix the controller die 32 relative to the RF power amplifier die 30. The desired X-Y coordinate on the top surface 54 (FIG. 2) can be referenced between a first reference point on RF power amplifier die 30 and a second reference point on the controller die 32. For example, the first reference point can be a corner of the RF power amplifier die 30 and the second reference point can be a corner of the controller die 32. Other reference points such as dedicated indicia (not shown) on the RF power amplifier die 30 and the controller die 32 can also be used as the first reference point and the second reference point, respectively.

Simulations of exemplary embodiments of the present disclosure were conducted using commercial thermal simulation software. An example of commercial thermal simulation software usable to determine a desired X-Y coordinate to fix the controller die 32 relative to the RF power amplifier die 30 is Chip-package Thermal Design software having a chip thermal model (CTM) that is provided by ANSYS, Inc., headquartered at 2600 ANSYS Drive, Canonsburg, Pa., 15317. Alternatively, infrared camera images of the RF power amplifier die 30 and the controller die 32 can be used during operation to experimentally determine and/or adjust a desired X-Y coordinate to fix the controller die 32 relative to the RF power amplifier die 30.

Assembly experiments pertaining to the integrated circuit module 26 indicate that a minimum offset of the controller die 32 must be placed away from the electrically conductive pads 34 (FIG. 1B) on the RF power amplifier die 30 as well as a minimum required contact area between the RF power amplifier die 30 and the controller die 32. Ranges for the X and Y dimensions shown in FIG. 4 were varied through the assembly experiments. The controller die 32 is attached on top of the RF power amplifier die 30 using a non-conductive epoxy. In order to attach the controller die 32 to the RF power amplifier die 30, it is desirable for an epoxy dispense tool (not shown) to have an epoxy extrusion area that ranges from around about 70% to around about 80% of a backside area of the controller die 32. Moreover, an epoxy extruder should be kept at a clearance height of around about 20 μm to around about 30 μm above the RF power amplifier die 30 when dispensing epoxy.

An epoxy that is usable to adhere the RF power amplifier die 30 and the controller die 32 together is a non-conductive type that is typically used in the semiconductor industry for die attachment. However, other adhesives are usable as well for the same purpose. However, when using epoxy it is desirable that the epoxy be free of large particle fillers. For example, it is desirable to limit particle size to an average diameter of on the order of less than 5 μm.

Figures 4, 5A, 5B:
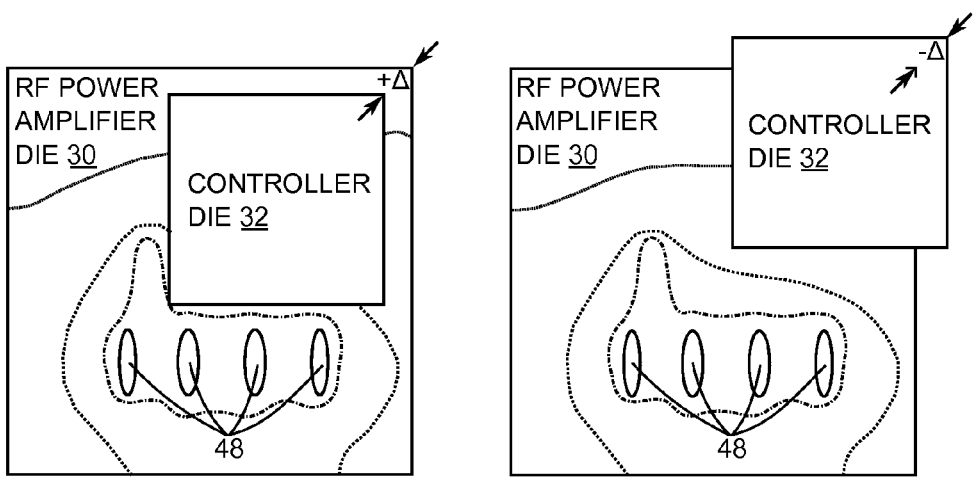
FIG. 4 is a table that lists operating parameters for a two stage RF amplifier operated first in an average power tracking (APT) mode and second in an envelope tracking (ET) mode.
FIG. 5A is a top view of a plurality of hot regions and exemplary thermal contours for the controller die stacked and positioned on the RF power amplifier die at a nominal +Δ location relative to the RF power amplifier die.
FIG. 5B is a top view of the plurality of hot regions and exemplary thermal contours for the controller die stacked and positioned on the RF power amplifier die at a nominal −Δ location relative to the RF power amplifier die.

FIG. 4 is a first table that lists operating parameters for a two stage RF amplifier operated first in an average power tracking (APT) mode and second in an envelope tracking (ET) mode. Power dissipation for the APT mode is at least twice as much as power dissipation for the ET mode for an output power of at least 28 dBm.

FIG. 5A is a top view of a plurality of hot regions 48 and exemplary thermal contours for the controller die 32 stacked and positioned on the RF power amplifier die 30 at a nominal +Δ location relative to an upper right corner of the RF power amplifier die 30. FIG. 5B is a top view of the plurality of hot regions 48 and exemplary thermal contours for the controller die 32 stacked and positioned on the RF power amplifier die 30 at the nominal −Δ location relative to the upper right corner of the RF power amplifier die 30. In both FIGS. 5A and 5B, temperatures within a dashed and dotted thermal contour line are relatively hot, while temperatures between an intermediate thermal contour line depicted with dotted line are relatively cooler. Temperatures between a finely dashed thermal contour line and the intermediate thermal contour line are relatively cooler still, and these temperatures are cool enough to not overheat the controller die 32 during normal operation. Note that the nominal location (not shown) of the controller die 32 relative to the RF power amplifier die 30 is an average between the nominal +Δ location and the nominal −Δ location.

FIG. 6 is a second table that lists temperatures for layers making up the stacked RF amplifier die 30 and the controller die 32 for various relative positions, and the ET and APT operating modes. FIG. 6 also lists power dissipated and thermal resistances for a silicon top of the controller die 32 and a reference (not shown).

Figure 7:
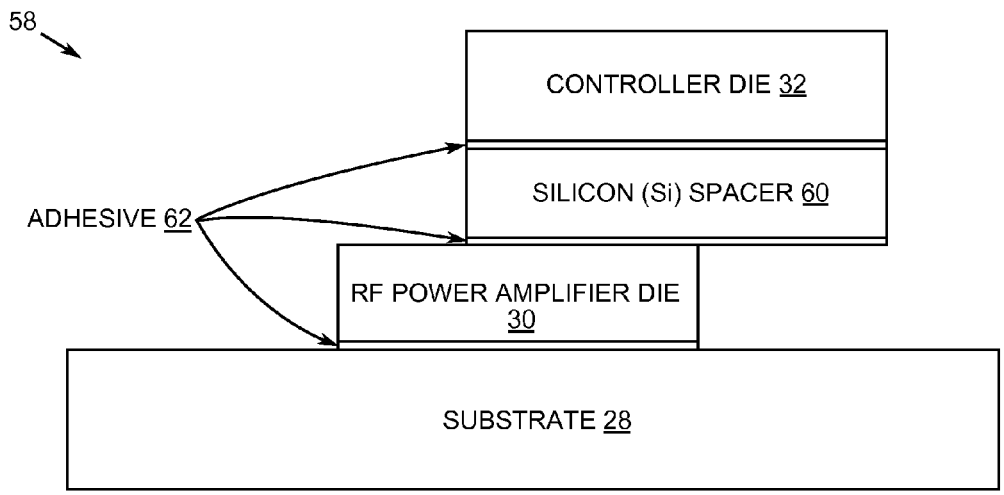
FIG. 7 is a side view of a stack of the RF amplifier die and the controller die.
Figure 8:
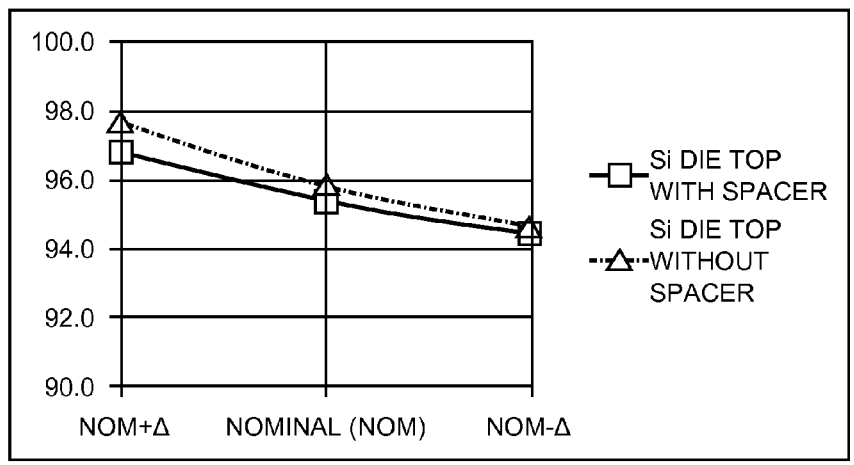
FIG. 8 is a graph depicting temperature curves for the top surface of the controller die with and without a silicon (Si) spacer.
Figure 9:
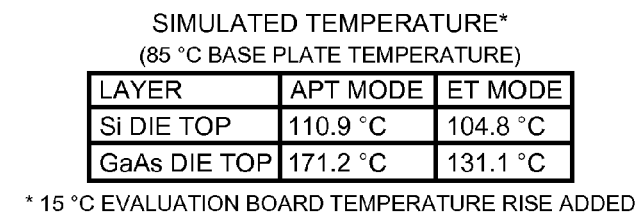
FIG. 9 is a third table listing steady state temperatures for the top surface of the controller die and the top surface of the RF power amplifier die during APT mode and ET mode.

FIG. 7 is a side view of an exemplary stack 58 of the RF power amplifier die 30 and the controller die 32 that includes silicon (Si) spacer 60 between the RF power amplifier die 30 and the controller die 32. FIG. 8 is a graph depicting temperature curves for a Si top surface of the controller die 32 with and without the Si spacer 60. In this particular example, the controller die 32 is made of Si and the RF power amplifier die 30 is made of gallium arsenide (GaAs). The Si spacer 60 has minimal effect on the temperature of the Si top surface. FIG. 9 is a third table listing simulated steady state temperatures for the top surface of the controller die 32 and the top surface of the RF power amplifier die 30 during APT mode and ET mode. In this exemplary case, the top surface of the controller die 32 is Si (i.e., Si die top) and the top surface of the RF power amplifier die 30 is GaAs (i.e., GaAs die top). The simulated steady state temperatures included a 15° C. evaluation board temperature rise and an 85° C. base plate temperature. A temperature difference between the Si die top and the GaAs die top is at least 60° C. for the APT mode and at least 26° C. for the ET mode.

Figure 10:
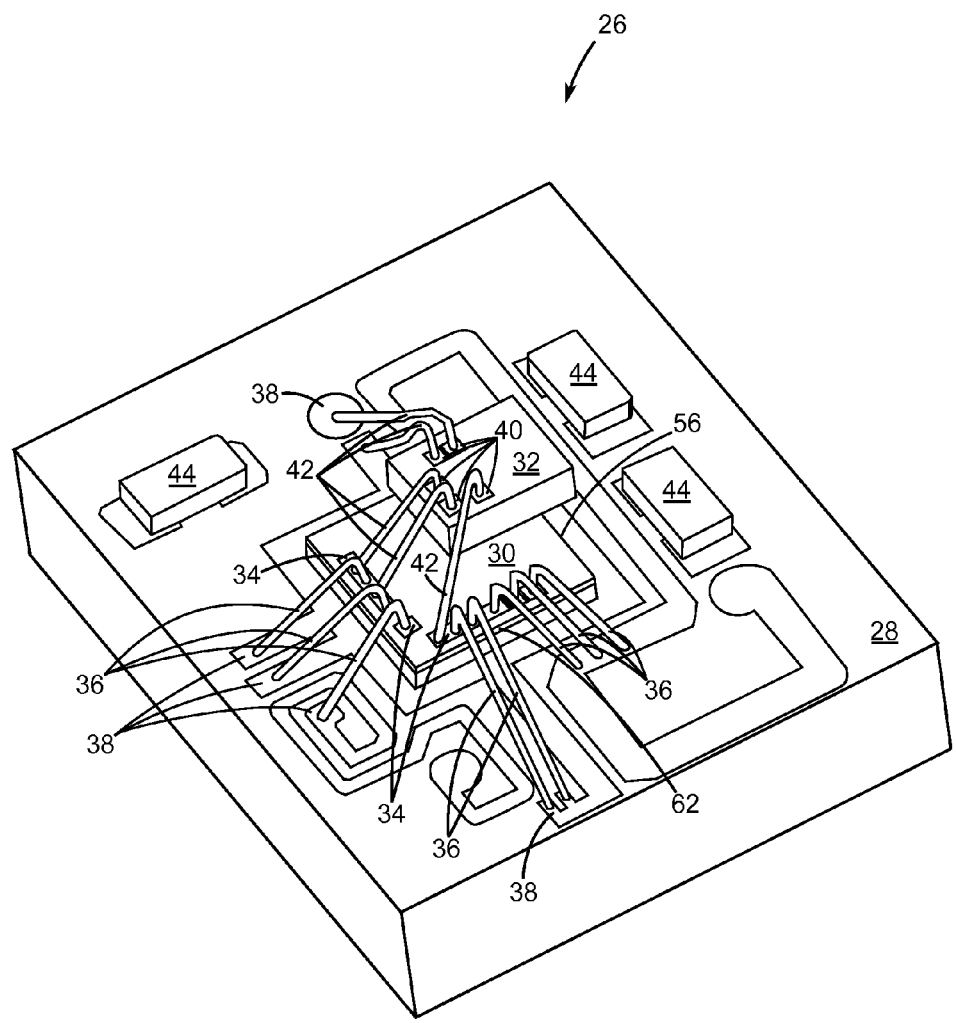
FIG. 10 is a line drawing of a three dimensional view of an exemplary embodiment of the integrated circuit module of the present disclosure.

FIG. 10 is a line drawing of a three dimensional view of an exemplary embodiment of the integrated circuit module 26 of FIGS. 1B, 2. In this exemplary embodiment, a relatively thick passivation layer 62 comprises the top surface of the RF power amplifier die 30. The passivation layer 62 has a thickness that ranges from around about 5 μm to around about 10 μm. In at least one embodiment, the passivation layer 62 is made of polyimide. In another embodiment, the passivation layer 62 is made of photosensitive polybenzoxazole (PBO).

Figure 11:
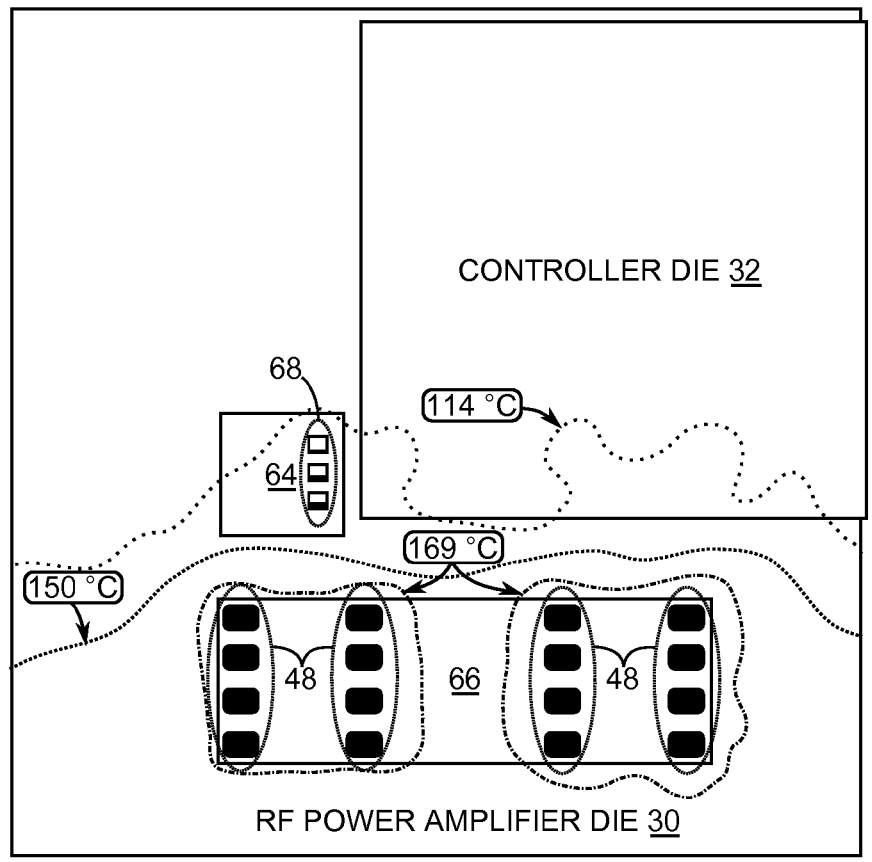
FIG. 11 is a top view of a plurality of hot regions for a two stage amplifier included on the RF amplifier die and thermal contours illustrating a 55° C. cooler temperature for the controller die.

FIG. 11 is a top view of a plurality of hot regions for a two stage amplifier comprising a first RF power amplifier stage 64 and a second RF power amplifier stage 66 that are included on the RF power amplifier die 30. Relatively warm regions 68 generated by the first RF power amplifier stage 64 are denoted by shaded rectangles. Temperatures within relatively hot thermal contours depicted in dotted and dashed lines are at least 169° C. Black rounded rectangles within the relatively hot thermal contours represent hot regions 48 generated by a 4×4 transistor array of the second RF power amplifier stage 66. Temperatures below an intermediate thermal contour depicted with a high density dashed line are at least 150° C., while temperatures below a relatively cool thermal contour depicted with a low density dashed line are at least 114° C. However, temperatures above the relatively cool thermal contour are at least less than 114° C. An exemplary maximum operating temperature for the controller die 32 is 125° C. Therefore, the controller die 32 is safe to operate in the configuration depicted in FIG. 11.

Ultimately, a determination for a location of the at least one cool region 46 of the RF power amplifier die 30 ensures that a temperature difference that ranges from around about 40° C. to around about 90° C. is established between the plurality of hot regions 48 and the at least one cool region 46 (FIG. 2) when the integrated circuit module 26 is operating under normal conditions. Note that in this exemplary case, a 55° C. cooler temperature relative to the second RF power amplifier stage 66 exists for the controller die 32. In at least one embodiment, the temperature difference between the plurality of hot regions 48 and the at least one cool region 46 when the integrated circuit module 26 is operating under normal conditions ranges from around about 40° C. to around about 65° C. In at least one other embodiment, the temperature difference between the plurality of hot regions 48 and the at least one cool region 46 when the integrated circuit module 26 is operating under normal conditions ranges from around about 66° C. to around about 90° C.

Figure 12:
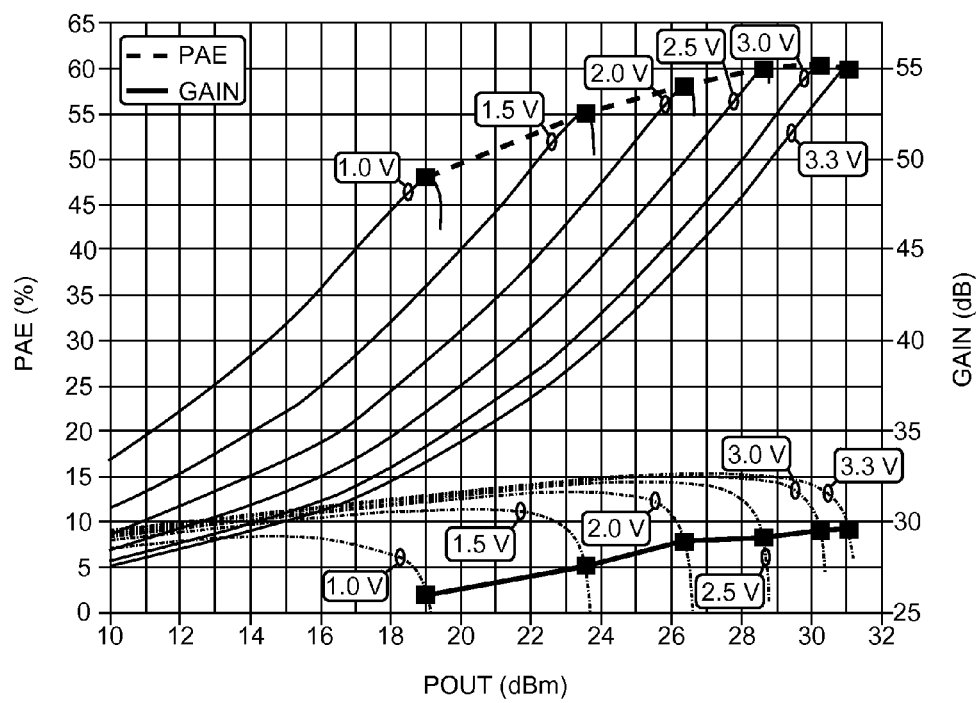
FIG. 12 is a graph depicting power added efficiency (PAE) and gain for continuous wave power sweeps for the integrated circuit module of FIG. 10 with supply voltages ranging from 1.0 V to 3.3 V.

FIG. 12 is a graph depicting power added efficiency (PAE) and gain for continuous wave power sweeps for the integrated circuit module 26 with supply voltages ranging from 1.0 V to 3.3 V. In particular, FIG. 12 indicates that PAE and gain are not adversely affected by the embodiments disclosed herein.

While the concepts discussed in this disclosure were applied to stacking a Si CMOS controller die on top of a GaAs heterojunction bipolar transistor (HBT) RF power amplifier die, the disclosed structures and method are also applicable to stacking any die on top of a power amplifier die that may include but is not limited to RF amplifiers, audio amplifiers, servo amplifiers, and the like. Moreover, this disclosure is not limited to a GaAs-type RF power amplifier die and/or a Si-type CMOS die. Power amplifies are fabricated in a variety of semiconductor materials including, but not limited to, GaAs, indium phosphide (InP), Si, silicon germanium (SiGe), and gallium nitride (GaN). Similarly, the die that is stacked on top could be a circuit other than a controller circuit, such as a sensor, an antenna, a digital signal processor (DSP) chip, microelectromechanical systems (MEMS) circuitry, or another separate analog or digital circuitry. The stacked die could be designed in a variety of semiconductor materials including, but not limited to, GaAs, InP, Si, SiGe, or GaN. While wire bonding was used for connections between the controller die 32 and the RF power amplifier die 30 in the exemplary integrated circuit module 26 of the present disclosure, other techniques such as flip chip mounting or through wafer vias could also be used.

Those skilled in the art will recognize improvements and modifications to the preferred embodiments of the present disclosure. All such improvements and modifications are considered within the scope of the concepts disclosed herein and the claims that follow.

What is claimed is:

1. An integrated circuit module comprising:
an RF power amplifier die having a plurality of hot regions and at least one cool region when operating under normal conditions, the RF power amplifier die having at least one RF power amplifier that resides in the plurality of hot regions and a top surface; and
a controller die having control circuitry configured to control the at least one RF power amplifier and a bottom surface, which is adhered to the top surface of the RF power amplifier die with non-conductive adhesive, wherein any portion of the bottom surface of the controller die that is adhered to the top surface of the RF power amplifier die resides exclusively on the at least one cool region.

2. The integrated circuit module of claim 1 wherein all of the bottom surface of the controller die is adhered to the top surface of the RF power amplifier die to reside exclusively on the at least one cool region.

3. The integrated circuit module of claim 1 wherein only a first portion of the bottom surface of the controller die is adhered to the top surface of the RF power amplifier die to reside exclusively on the at least one cool region, and a second region of the controller die hangs over a peripheral edge of the RF power amplifier die.

4. The integrated circuit module of claim 1 further including a first plurality of electrically conductive pads on an exposed portion of the top surface of the RF power amplifier die and a second plurality of electrically conductive pads on a top surface of the controller die with at least one bonding wire extending between at least one of the first plurality of electrically conductive pads and the at least one of the second plurality of electrically conductive pads.

5. The integrated circuit module of claim 1 wherein a passivation layer comprises the top surface of the RF power amplifier die.

6. The integrated circuit module of claim 5 wherein the passivation layer ranges in thickness from around about 5 μm to around about 10 μm.

7. The integrated circuit module of claim 1 wherein the RF power amplifier die comprises gallium arsenide (GaAs) technology.

8. The integrated circuit module of claim 1 wherein the controller die comprises silicon (Si) technology.

9. The integrated circuit module of claim 8 wherein the controller die further comprises complementary metal oxide semiconductor (CMOS) technology.

10. The integrated circuit module of claim 1 wherein the plurality of hot regions and the at least one cool region when operating under normal conditions has a temperature difference that ranges from around about 40° C. to around about 90° C.

11. A method of making an integrated circuit module comprising:
providing an RF power amplifier die having a plurality of hot regions and at least one cool region when operating under normal conditions, the RF power amplifier die having a top surface and at least one RF power amplifier that resides in the plurality of hot regions;
providing a controller die having a bottom surface and control circuitry configured to control the at least one RF power amplifier;
determining a location of the at least one cool region of the RF power amplifier die; and
adhering the bottom surface of the controller die to the top surface of the RF power amplifier die with non-conductive adhesive such that any portion of the bottom surface that is adhered to the top surface of the RF power amplifier die resides exclusively on the at least one cool region.

12. The method of making the integrated circuit module of claim 11 wherein the bottom surface of the controller die is adhered to the top surface of the RF power amplifier die such that all of the bottom surface of the controller die resides exclusively on the at least one cool region.

13. The method of making the integrated circuit module of claim 11 wherein only a first portion of the bottom surface of the controller die is adhered to the top surface of the RF power amplifier die to reside exclusively on the at least one cool region, and a second region of the controller die hangs over a peripheral edge of the RF power amplifier die.

14. The method of making the integrated circuit module of claim 11 further including bonding at least one of a first plurality of electrically conductive pads on an exposed portion of the top surface of the RF power amplifier die to at least one of a second plurality of electrically conductive pads on a top surface of the controller die with at least one bonding wire.

15. The method of making the integrated circuit module of claim 11 further including disposing a passivation layer onto the RF power amplifier die to fabricate the top surface of the RF power amplifier die.

16. The method of making the integrated circuit module of claim 11 wherein the passivation layer ranges in thickness from around about 5 μm to around about 10 μm.

17. The method of making the integrated circuit module of claim 11 wherein determining the location of the at least one cool region of the RF power amplifier die ensures that a temperature difference that ranges from around about 40° C. to around about 90° C. is established between the plurality of hot regions and the at least one cool region when the integrated circuit module is operating under normal conditions.

18. The method of making the integrated circuit module of claim 11 wherein the RF power amplifier die comprises gallium arsenide (GaAs) technology.

19. The method of making the integrated circuit module of claim 11 wherein the controller die comprises Si technology.

20. The method of making the integrated circuit module of claim 19 wherein the controller die further comprises CMOS technology.

* * * * *